United States Patent
Chi et al.

(10) Patent No.: US 11,824,020 B2
(45) Date of Patent: *Nov. 21, 2023

(54) SEMICONDUCTOR PACKAGE STRUCTURE INCLUDING ANTENNA

(71) Applicant: MEDIATEK INC., Hsinchu (TW)

(72) Inventors: Yen-Yao Chi, Hsinchu (TW); Nai-Wei Liu, Hsinchu (TW); Tzu-Hung Lin, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/046,218

(22) Filed: Oct. 13, 2022

(65) Prior Publication Data
US 2023/0056550 A1   Feb. 23, 2023

Related U.S. Application Data

(63) Continuation of application No. 16/910,354, filed on Jun. 24, 2020, now Pat. No. 11,508,678.
(Continued)

(51) Int. Cl.
*H01L 23/66*   (2006.01)
*H01L 23/31*   (2006.01)
(Continued)

(52) U.S. Cl.
CPC .......... *H01L 23/66* (2013.01); *H01L 23/3128* (2013.01); *H01L 23/5383* (2013.01);
(Continued)

(58) Field of Classification Search
CPC ............ H01L 24/20; H01L 2224/214; H01L 23/49816; H01L 23/5385; H01L 23/66;
(Continued)

(56) References Cited

U.S. PATENT DOCUMENTS 9,461,355 B2   10/2016   Nair et al.
9,935,065 B1   4/2018   Baheti et al.
(Continued)

FOREIGN PATENT DOCUMENTS

TW   201813041 A   4/2018
TW   201901864 A   1/2019
(Continued)

OTHER PUBLICATIONS

European Search Report dated Sep. 29, 2020, issued in application No. EP 20185395.9.
(Continued)

*Primary Examiner* — Jasmine J Clark
(74) *Attorney, Agent, or Firm* — McClure, Qualey & Rodack, LLP (57) ABSTRACT

An electronic device that has an antenna device that includes a conductive pattern layer comprising a first antenna element, the conductive pattern layer formed in an insulating substrate and adjacent to a first surface of the insulating substrate, and a second antenna element formed on a second surface of the insulating substrate opposite the first surface. The electronic device further has a semiconductor package that includes a redistribution layer (RDL) structure bonded and electrically connected to the conductive pattern layer, a first electronic component electrically connected to the RDL structure, and an encapsulating layer formed on the RDL structure and surrounding the first electronic component.

20 Claims, 4 Drawing Sheets

Related U.S. Application Data (60) Provisional application No. 62/881,437, filed on Aug. 1, 2019.

(51) Int. Cl.
*H01L 23/538* (2006.01)
*H01L 23/00* (2006.01)
*H01Q 1/22* (2006.01)
*H01Q 1/38* (2006.01)

(52) U.S. Cl.
CPC ...... *H01L 23/5386* (2013.01); *H01L 23/5389* (2013.01); *H01L 24/20* (2013.01); *H01Q 1/2283* (2013.01); *H01Q 1/38* (2013.01); *H01L 2223/6672* (2013.01); *H01L 2223/6677* (2013.01); *H01L 2224/214* (2013.01)

(58) Field of Classification Search
CPC ............. H01L 23/3128; H01L 23/5383; H01L 23/5386; H01L 23/5389; H01L 2223/6677; H01Q 1/2283; H01Q 1/38
USPC ........................................................ 257/428
See application file for complete search history.

(56) References Cited

U.S. PATENT DOCUMENTS

| | | |
|---|---|---|
| 10,490,880 B2 | 11/2019 | Lasiter et al. |
| 11,508,678 B2* | 11/2022 | Chi ................... H01L 23/49816 |
| 2017/0040266 A1 | 2/2017 | Lin et al. |
| 2017/0365587 A1 | 12/2017 | Hung et al. |
| 2018/0358685 A1 | 12/2018 | Han et al. |
| 2019/0035749 A1 | 1/2019 | Dalmia et al. |
| 2019/0115310 A1 | 4/2019 | Baek et al. |
| 2019/0139913 A1 | 5/2019 | Fang et al. |

FOREIGN PATENT DOCUMENTS

| | | |
|---|---|---|
| TW | 20191915 A | 5/2019 |
| TW | 201919157 A | 5/2019 |

OTHER PUBLICATIONS

Chinese language office action dated Feb. 20, 2021, issued in application No. TW 109126066.

\* cited by examiner

SEMICONDUCTOR PACKAGE STRUCTURE INCLUDING ANTENNA

CROSS REFERENCE TO RELATED APPLICATIONS

The present application is a continuation of U.S. application Ser. No. 16/910,354, filed Jun. 24, 2020, now U.S. Pat. No. 11,508,678, which claims the benefit of U.S. Provisional Application No. 62/881,437 filed on Aug. 1, 2019, the entirety of which is incorporated by reference herein.

BACKGROUND OF THE INVENTION

Field of the Invention

The present invention relates to a package structure, and in particular to a fan-out semiconductor package structure that includes antennas.

Description of the Related Art

In order to ensure the continued miniaturization and multi-functionality of electronic products and communication devices, semiconductor packages must be small in size, support multi-pin connection, operate at high speeds, and have high functionality. Additionally, in a high-frequency application such as a radio frequency (RF) system-in-package (SiP) assembly, antennas are typically used for enabling wireless communication.

When wireless communication packages with antennas are constructed, package designs need to provide good antenna properties (such as high efficiency, wide bandwidth, etc) while providing reliable and low-cost package solutions. In a conventional semiconductor package structure, a substrate based antenna is bonded with a chip. Since the substrate based antenna is thick, it is difficult to reduce the package size, and high chip to antenna loss is induced due to long trace length. Moreover, substrate based antenna provide a poor thermal performance due to the long heat-dissipation path of the chip bonded thereon.

Thus, a novel semiconductor package structure is desirable.

BRIEF SUMMARY OF THE INVENTION

In one embodiment, an electronic device has an antenna device that includes a conductive pattern layer comprising a first antenna element, the conductive pattern layer formed in an insulating substrate and adjacent to a first surface of the insulating substrate, and a second antenna element formed on a second surface of the insulating substrate opposite the first surface. The electronic device further has a semiconductor package that includes a redistribution layer (RDL) structure bonded and electrically connected to the conductive pattern layer, a first electronic component electrically connected to the RDL structure, and an encapsulating layer formed on the RDL structure and surrounding the first electronic component.

Another exemplary embodiment is directed to an electronic device, comprising: a redistribution (RDL) structure having a first surface and a second surface opposite the first surface; a first electronic component having an active surface formed on the first surface of the RDL structure; a plurality of first electrical connectors formed on the second surface of the RDL structure; an insulating substrate having a first surface stacked on the second surface of the RDL structure; a conductive pattern layer comprising a first antenna element, formed in the insulating substrate and adjacent to the first surface of the insulating substrate; a second antenna element formed on a second surface of the insulating substrate opposite the first surface of the insulating substrate; and a plurality of second electrical connectors formed on the first surface of the insulating substrate and electrically connected to the first antenna element, wherein the plurality of second electrical connectors is larger than the plurality of first electrical connectors.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Figure 1:
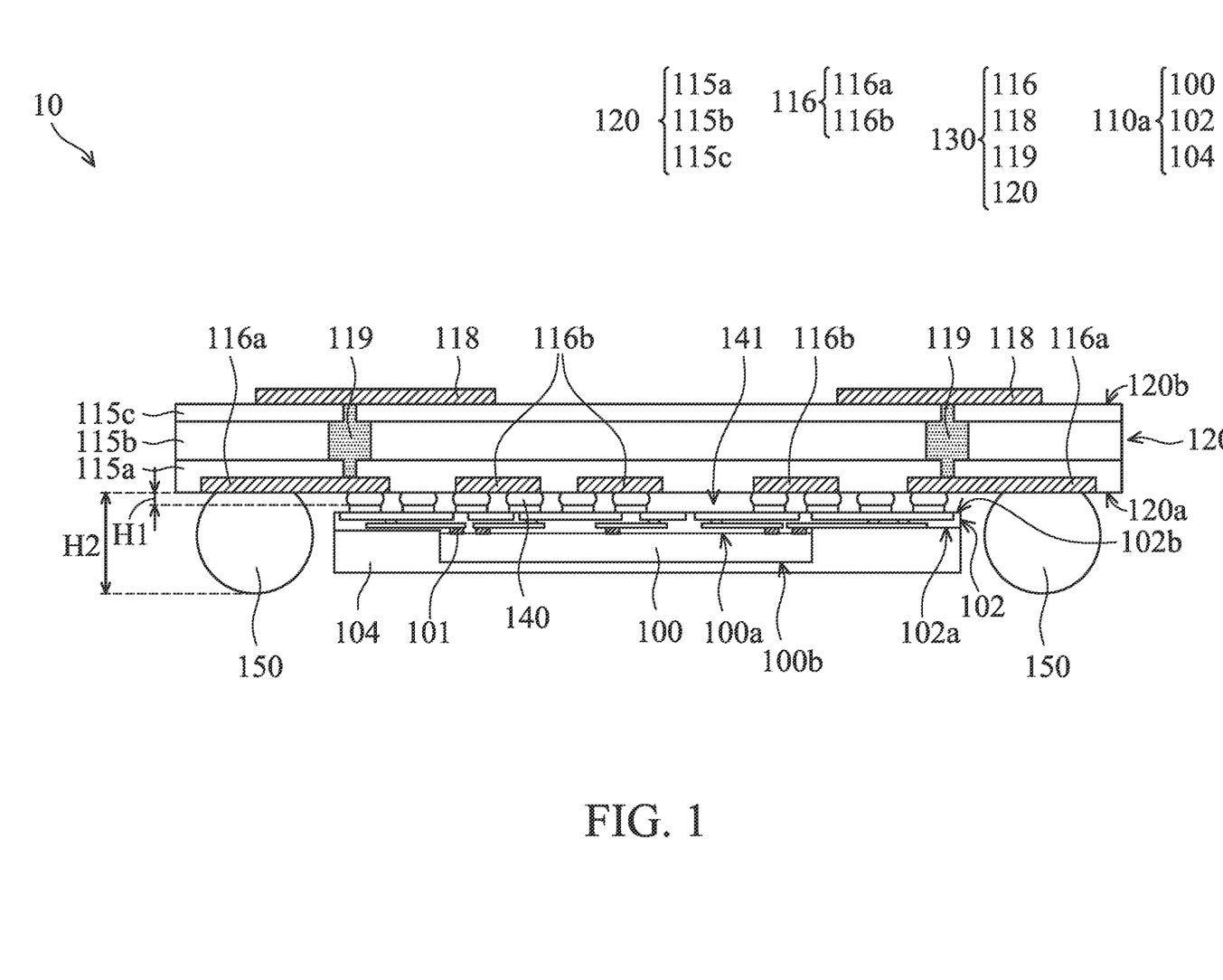
FIG. 1 is a cross-sectional view of an exemplary semiconductor package structure in accordance with some embodiments.

FIG. 1 is a cross-sectional view of an exemplary semiconductor package structure 10 in accordance with some embodiments. In some embodiments, the semiconductor package structure 10 is a wafer-level semiconductor package structure, and is a flip-chip semiconductor package structure. The semiconductor package structure 10 may be mounted on a base (not shown). For example, the semiconductor package structure 10 may be a system-on-chip (SOC) package structure. Moreover, the base may include a printed circuit board (PCB) and may be formed of polypropylene (PP).

Alternatively, the base is a package substrate. The semiconductor package structure 10 is mounted onto the base by a bonding process. For example, the semiconductor package structure 10 includes electrical connectors 150 that are mounted on and electrically coupled to the base by the bonding process. In some embodiments, each of the electrical connectors 150 includes a conductive bump structure such as a copper bump or a solder ball, as shown in FIG. 1. Alternatively, each of the electrical connectors 150 includes a conductive pillar structure, a conductive wire structure, or a conductive paste structure.

In some embodiments, the semiconductor package structure 10 further includes a semiconductor package 110a, electrical connectors 140, and an antenna device 130 stacked on and mounted onto the underlying semiconductor package 110a via the electrical connectors 140, as shown in FIG. 1. In some embodiments, each of the electrical connectors 140 includes a conductive bump structure such as a copper bump or a solder ball. Alternatively, each of the electrical connectors 140 includes a conductive pillar structure, a conductive wire structure, or a conductive paste structure. In some embodiments, the electrical connectors 140 and the electrical connectors 150 are solder balls, and a ball size of electrical connectors is different than that of the plurality of first electrical connectors. For example, the height H1 of the electrical connectors 140 is lower than the height H2 of the electrical connectors 150, as shown in FIG. 1.

In some embodiments, the semiconductor package 110a includes a semiconductor die 100. For example, the semiconductor die 100 is a system-on-chip (SOC) die that may include a microcontroller (MCU), a microprocessor (MPU), a power management integrated circuit (PMIC), a global positioning system (GPS) device, or a radio frequency (RF) device or any combination thereof.

The semiconductor die 100 has two opposing sides. More specifically, the semiconductor die 100 has an active surface 100a and a non-active surface 100b opposite to the active surface 100a. The non-active surface 100b may also be referred to as a rear surface and the active surface 100a may also be referred to as a front surface that is opposite to the rear surface. In some embodiments, the semiconductor die 100 includes pads 101 that are disposed on the active surface 100a and electrically connected to one or more functional circuits (not shown) of the semiconductor die 100. In some embodiments, the pads 101 of the semiconductor die 100 belong to the uppermost metal layer of the interconnection structure (not shown) of the semiconductor die 100.

In some embodiments, the semiconductor package 110a of the semiconductor package structure 10 includes a redistribution layer (RDL) structure 102 having a first surface 102a and a second surface 102b opposite the first surface 102a. The RDL structure 102, which is also referred to as a fan-out RDL structure. In some embodiments, the RDL structure 102 is disposed on the active surface 100a of the semiconductor die 100 and electrically connected to the semiconductor die 100 through the pads 101 of the semiconductor die 100.

In some embodiments, the RDL structure 102 includes one or more conductive traces disposed in an inter-metal dielectric (IMD) layer. For example, first conductive traces are disposed at a first layer-level of the IMD layer adjacent to the first surface 102a of the RDL structure 102. At least one of the first conductive traces is electrically coupled to the semiconductor die 100. Moreover, second conductive traces are disposed at a second layer-level higher than the first layer-level of the IMD layer and adjacent to the second surface 102b of the RDL structure 102. Moreover, at least one of the second conductive traces is bonded and electrically coupled to one or more electrical connectors 140, so that the electrical connectors 140 are electrically coupled to the semiconductor die 100 via the RDL structure 102.

The IMD layer may include a first sub-dielectric layer and a second sub-dielectric layer successively stacked from the active surface 100a of the semiconductor die 100, such that the first conductive traces are formed in the first sub-dielectric layer and the second conductive traces are formed in the second sub-dielectric layer. In some embodiments, the IMD layer is formed of an organic material, which includes a polymer base material, a non-organic material, which includes silicon nitride ($SiN_x$), silicon oxide ($SiO_x$), graphene, or the like. For example, the first sub-dielectric layers and the second sub-dielectric layer may be made of a polymer base material. In some other embodiments, the IMD layer is made of a high-k (k is the dielectric constant of the dielectric layer) dielectric layer.

It should be noted that the number of conductive traces and the number of sub-dielectric layers of the RDL structure 102 shown in FIG. 1 are only an example and are not a limitation to that disclosed in the embodiment.

In some embodiments, the semiconductor package 110a of the semiconductor package structure 10 further includes an encapsulating layer 104 formed on the first surface 102a of the RDL structure 102. The encapsulating layer 104 surrounds the semiconductor die 100 and covers the non-active surface 100a of the semiconductor die 100. The encapsulating layer 104 has a sidewall (or edge) that is substantially aligned to (or level with) the sidewall (or edge) of the RDL structure 102.

Moreover, the encapsulating layer 104 and the semiconductor die 100 are separated from the electrical connectors 140 through the RDL structure 102. In other words, the electrical connectors 140 are free from contact with the encapsulating layer 104 and the semiconductor die 100.

The encapsulating layer 104 may be made of a molding compound material, such as an epoxy, a resin, a moldable polymer, or the like. The molding compound material may be applied while substantially liquid, and then may be cured through a chemical reaction, such as in an epoxy or resin. For example, the molding compound material may be an ultraviolet (UV) or thermally cured polymer applied as a gel or malleable solid capable of being disposed around the semiconductor die 100, and then is cured through a UV or thermal curing process. The molding compound material may be cured with a mold (not shown).

In some embodiments, the antenna device 130 includes an insulating substrate 120. The insulating substrate 120 has a first surface 120a and a second surface 120b opposite the first surface 120a. In some embodiments, the first surface 120a of the insulating substrate 120 is adhered to the second surface RDL structure 102 via the electrical connectors 140.

The insulating substrate 120 may be a single layer or a multi-layer structure and include any one of core insulating materials, for example, glass epoxy resin, bismaleimide-triazine (BT), or ABF. In some embodiments, the insulating substrate 120 includes a first sub-dielectric layer 115a, a second sub-dielectric layer 115b, and a third sub-dielectric layer 115c successively stacked from the first surface 120a of the insulating substrate 120.

In some embodiments, the antenna device 130 includes a conductive pattern layer 116 including a first antenna element 116a and one or more conductive traces 116b, formed in the first sub-dielectric layer 115a of insulating substrate 120. The first antenna element 116a is bonded and electrically connected to one or more electrical connectors 150 and the conductive traces 116b are bonded and electrically connected to electrical connectors 140 and 150.

In those cases, the electrical connectors 140 bonded between the RDL structure 102 and the conductive pattern layer 116, so that the conductive pattern layer 116 is separated from the RDL structure 102 by a gap 141. Moreover, the electrical connectors 150 are electrically connected to the first antenna element 116a of the conductive pattern layer 116 and surround the semiconductor package 110a.

In some embodiments, the antenna device 130 further includes a second antenna element 118 formed on the second surface 120b of the insulating substrate 120 (i.e., the top surface of the third sub-dielectric layer 115c) and one or more through-via structures 119 formed in the first sub-dielectric layer 115a, the second sub-dielectric layer 115b, and the third sub-dielectric layer 115c. The through-via structures 119 may be referred to as through insulator vias (TIVs) and are electrically connected between the first antenna element 116a and the second antenna element 118, so as to form an antenna in the antenna device 130. In some embodiments, the conductive pattern layer 116, the second antenna element 118, and the through-via structures 119 are made of a metal material, such as copper or another suitable antenna material.

It should be noted that the number of conductive pattern layers and the number of sub-dielectric layers of the insulating substrate shown in FIG. 1 are only an example and are not a limitation to that disclosed in the embodiment.

Figure 2:
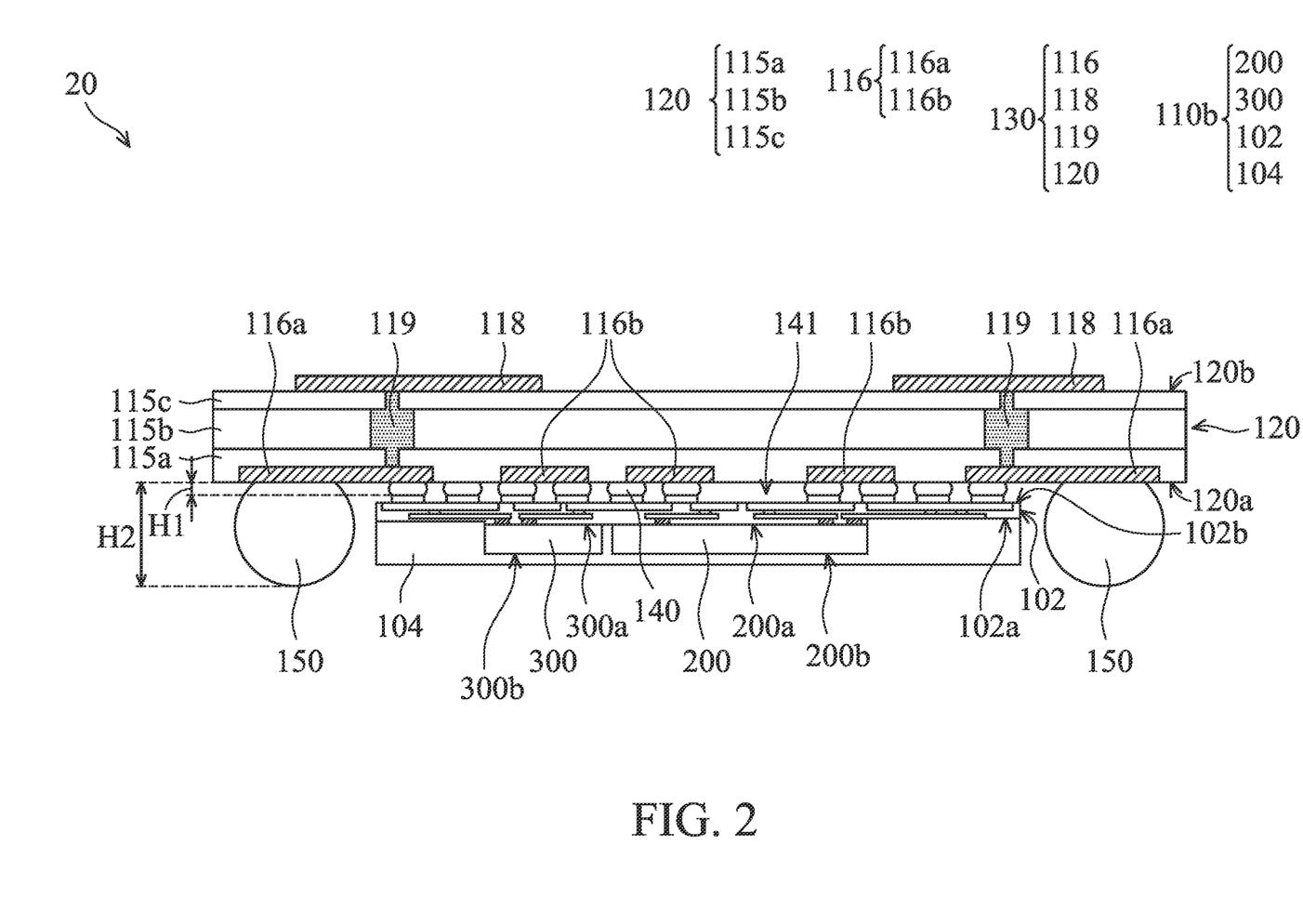
FIG. 2 is a cross-sectional view of an exemplary semiconductor package structure in accordance with some embodiments.

FIG. 2 is a cross-sectional view of an exemplary semiconductor package structure 20 in accordance with some embodiments of the disclosure. Descriptions of elements of the embodiments hereinafter that are the same as or similar to those previously described with reference to FIG. 1 may be omitted for brevity. In the embodiment, the semiconductor package structure 20 is similar to the semiconductor package structure 10 shown in FIG. 1. As shown in FIG. 2, unlike the semiconductor package 110a of the semiconductor package structure 10, the semiconductor package 110b of the semiconductor package structure 20 includes more than one semiconductor dies. In some embodiments, the semiconductor package 110b includes semiconductor dies 200 and 300 electrically connected to the RDL structure 102 and surrounded by the encapsulating layer 104. More specifically, similar to the semiconductor die 100 shown in FIG. 1, the semiconductor die 200 has an active surface 200a and a non-active surface 200b opposite to the active surface 200a. The semiconductor die 300 has an active surface 300a and a non-active surface 300b opposite to the active surface 300a. Moreover, the RDL structure 102 is disposed on and bonded to the active surface 200a of the semiconductor die 200 and the active surface 300a of the semiconductor die 300, so that semiconductor die 100 through the pads 101 of the semiconductor die 100.

In some embodiments, a dimension of the semiconductor die 200 is different than a dimension of the semiconductor die 300. For example, the dimension of the semiconductor die 200 is smaller than the dimension of the semiconductor die 300.

It should be noted that the number of semiconductor die shown in FIG. 2 is only an example and are not a limitation to that disclosed in the embodiment.

In some other embodiments, a functional circuit of the semiconductor die 200 is different than that of the semiconductor die 300. For example, the semiconductor die 200 and/or the semiconductor die 300 is a logic die including a central processing unit (CPU), a graphics processing unit (GPU), a dynamic random access memory (DRAM) controller or any combination thereof. Alternatively, the semiconductor die 200 and/or the semiconductor die 300 are a system-on-chip (SOC) die. In those cases, the semiconductor dies 200 and 300 can be formed by different technology nodes.

Figure 3:
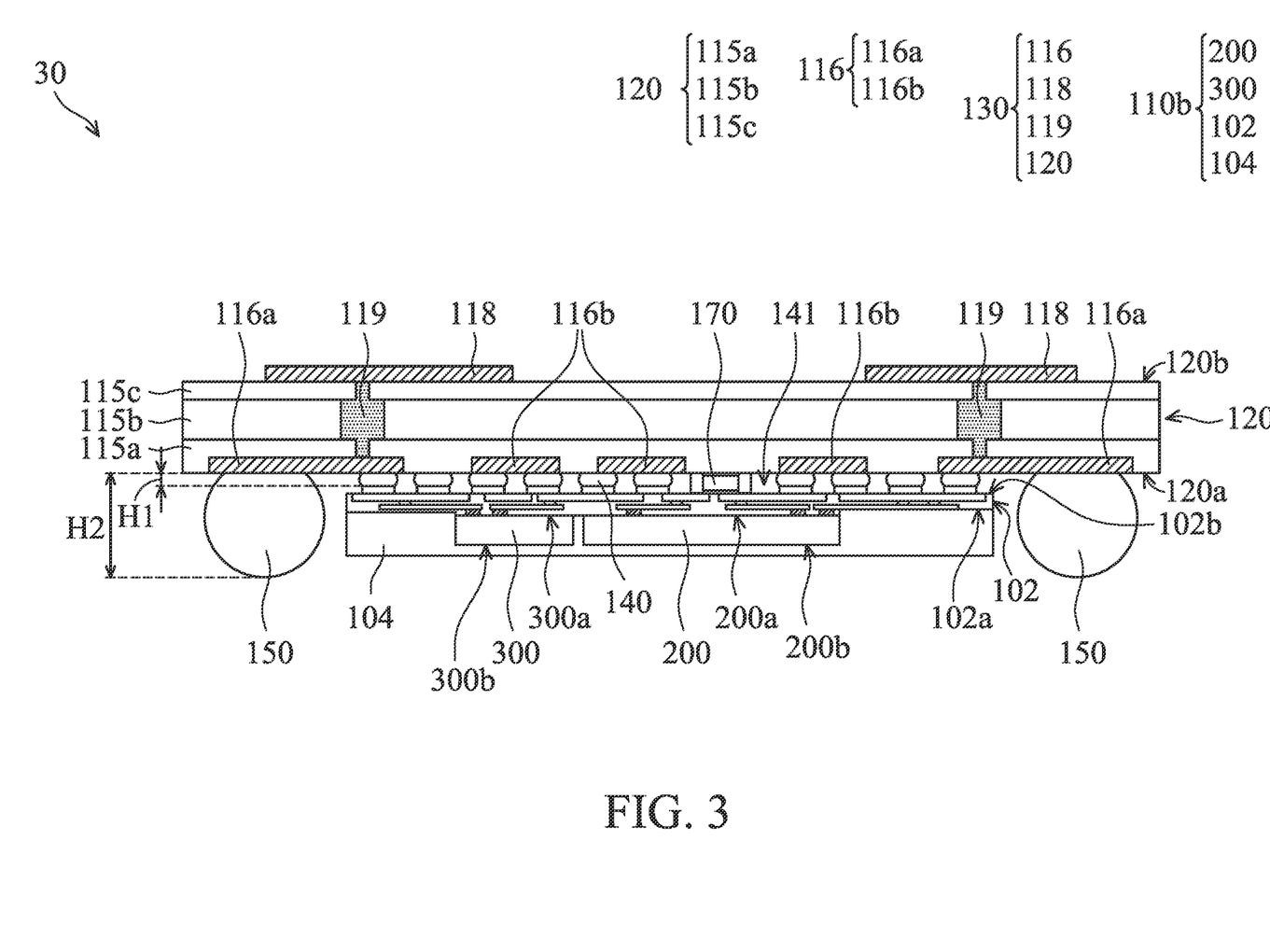
FIG. 3 is a cross-sectional view of an exemplary semiconductor package structure in accordance with some embodiments.

FIG. 3 is a cross-sectional view of an exemplary semiconductor package structure 30 in accordance with some embodiments of the disclosure. Descriptions of elements of the embodiments hereinafter that are the same as or similar to those previously described with reference to FIG. 2 may be omitted for brevity. In the embodiment, the semiconductor package structure 30 is similar to the semiconductor package structure 20 shown in FIG. 2, except that the semiconductor package structure 30 further includes a passive device 170 formed in the gap 141 between the conductive pattern layer 116 and the RDL structure 102 and electrically connected to the RDL structure 102. The passive device 170 may be disposed between at least two electrical connectors 114, as shown in FIG. 3. In some embodiments, the passive device 170 includes a capacitor, an inductor, a resistor, or a combination thereof. In some embodiments, the passive device 170 is an integrated passive device (IPD). In some embodiments, passive device 170 may contact the second surface 120b of the insulating substrate 120.

Figure 4:
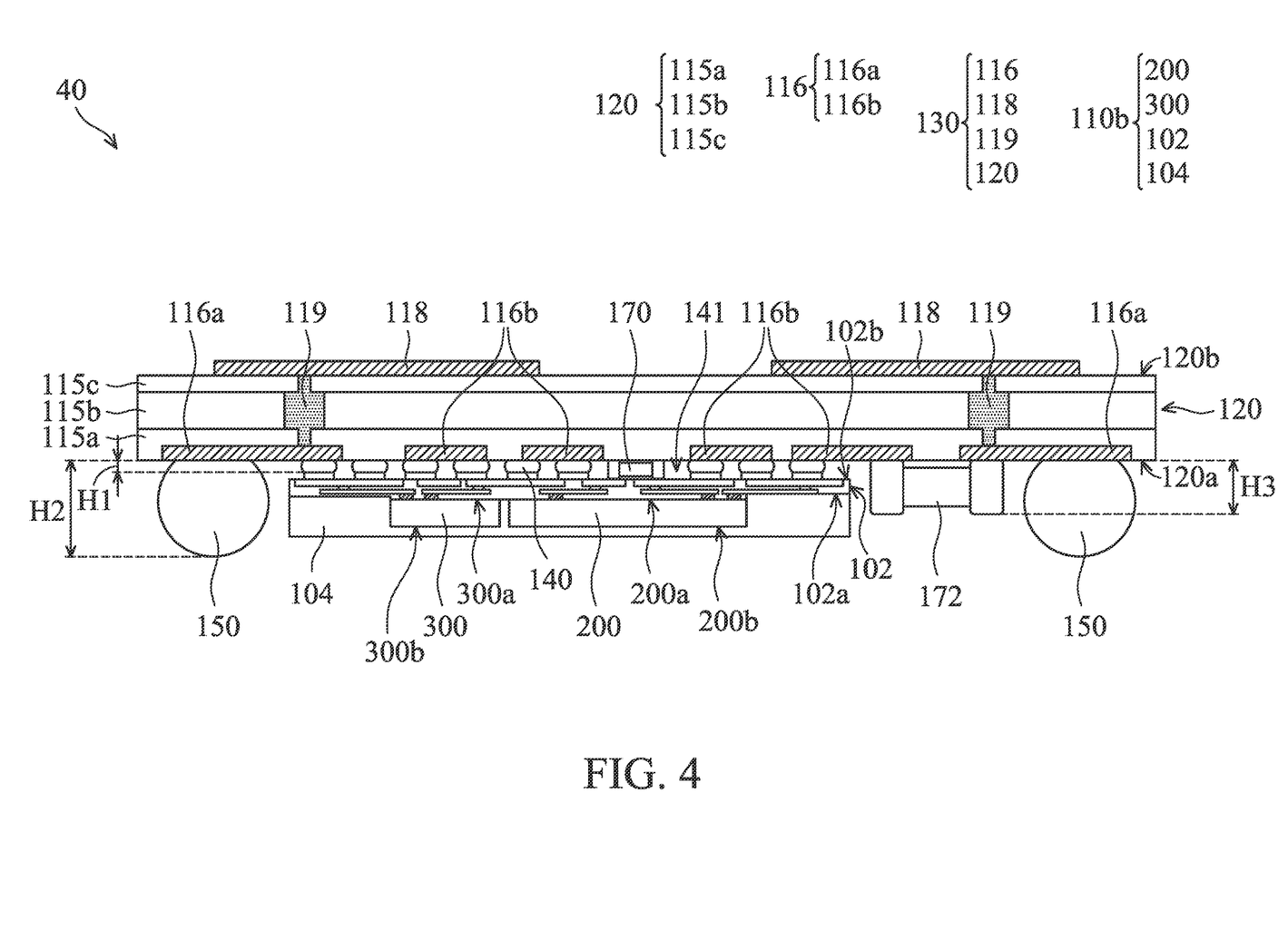
FIG. 4 is a cross-sectional view of an exemplary semiconductor package structure in accordance with some embodiments.

FIG. 4 is a cross-sectional view of an exemplary semiconductor package structure 40 in accordance with some embodiments of the disclosure. Descriptions of elements of the embodiments hereinafter that are the same as or similar to those previously described with reference to FIG. 3 may be omitted for brevity. In the embodiment, the semiconductor package structure 40 is similar to the semiconductor package structure 30 shown in FIG. 3, except that the semiconductor package structure 40 further includes a passive device 172 that has a different dimension than that of the passive device 170. In some embodiments, the passive device 172 is electrically connected to the conductive pattern layer 116 and between the semiconductor package 110b and at least one of the electrical connectors 150. In some embodiments, the passive device 172 has a greater dimension than that of the passive device 170. Moreover, the passive device 172 has a dimension (e.g., a height H3) greater than that of the electrical connectors 140 and the passive device 170. As an example, the passive device 172 has the height H3 that is not less than 100 um, and the passive device 170 has a height that is not greater than 100 um. Moreover, the height H3 of the passive device 172 is greater than the height of the passive device 170.

According to the foregoing embodiments, the semiconductor package structure is designed to fabricate an antenna integrated into the semiconductor package structure. In the semiconductor package structure, it allows that the antenna is formed in an insulating substrate which is bonded to an RDL structure of the semiconductor package by the use of bump structures (e.g., solder balls). Compare to a substrate based antenna bonded with a semiconductor die/chip, the thickness of the insulating substrate with the antenna can be reduced due to the fin pitch RDL structure of the underlying semiconductor package. As a result, the size of the semiconductor package structure and the die to antenna loss can be reduced. Compact to fan-out package integrated with an antenna, the manufacturing cost of the semiconductor package structure can be reduced and the process for the fabrication of the semiconductor package structure can be simplified because the antenna is fabricated by a mature substrate technology.

According to the foregoing embodiments, since the thickness of the insulating substrate with the antenna therein is reduced to provide short heat-dissipation path of the semiconductor die in the semiconductor package, thermal performance can be improved.

According to the foregoing embodiments, since the antenna is formed in the insulating substrate that is separated from the semiconductor package having the semiconductor die therein, known good die package and known good antenna can be used during the fabrication of the semiconductor package structure, thereby preventing the yield loss and reducing the manufacturing cost of the semiconductor package structure further.

According to the foregoing embodiments, since the semiconductor dies can be formed by different technology nodes before placing those semiconductor dies in the semiconductor package, the die partition can be enabled and the process for the fabrication of the semiconductor package can be simplified, thereby reducing the manufacturing cost of the semiconductor package.

According to the foregoing embodiments, since a passive device is integrated in the semiconductor package structure, the electrical performance can be improved.

According to the foregoing embodiments, since passive devices with different dimensions can be integrated in semiconductor package structures, the electrical performance can be improved further. Moreover, the flexibility of integrating a large passive device into a semiconductor package structure can be increased.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
   an antenna device, comprising:
   a conductive pattern layer comprising a first antenna element, the conductive pattern layer formed in an insulating substrate and adjacent to a first surface of the insulating substrate; and
   a second antenna element formed on a second surface of the insulating substrate opposite the first surface; and
   a semiconductor package, comprising:
   a redistribution layer (RDL) structure bonded and electrically connected to the conductive pattern layer;
   a first electronic component electrically connected to the RDL structure; and
   an encapsulating layer formed on the RDL structure and surrounding the first electronic component.

2. The electronic device as claimed in claim 1, further comprising:
   a plurality of first electrical connectors bonding the RDL structure to the conductive pattern layer, so that the conductive pattern layer is separated from the RDL structure by a gap; and
   a plurality of second electrical connectors electrically connected to the conductive pattern layer and surrounding the semiconductor package.

3. The electronic device as claimed in claim 2, wherein the plurality of first electrical connectors and the plurality of second electrical connectors are solder balls, wherein the solder balls of the first electrical connectors are a different size than the solder balls of the second electrical connectors.

4. The electronic device as claimed in claim 2, further comprising:
   a passive device formed in the gap between the conductive pattern layer and the RDL structure and electrically connected to the RDL structure.

5. The electronic device as claimed in claim 2, further comprising:
   a passive device electrically connected to the conductive pattern layer and between the semiconductor package and at least one of the second electrical connectors.

6. The electronic device as claimed in claim 5, wherein the plurality of first electrical connectors has a height that is less than a height of the passive device.

7. The electronic device as claimed in claim 1, wherein the semiconductor package further comprises:
   a second electronic component electrically connected to the RDL structure and surrounded by the encapsulating layer, wherein the second electronic component is a different size than the first electronic component.

8. The electronic device as claimed in claim 1, wherein the semiconductor package further comprises:
   a second electronic component electrically connected to the RDL structure and surrounded by the encapsulating layer, wherein a functional circuit of the second electronic component is different than a functional circuit of the first electronic component.

9. The electronic device as claimed in claim 1, wherein the antenna device further comprises:
   at least one through-via structure formed in the insulating substrate and electrically connecting the first antenna element and the second antenna element.

10. An electronic device, comprising:
    a redistribution (RDL) structure having a first surface and a second surface opposite the first surface;
    a first electronic component having an active surface formed on the first surface of the RDL structure;
    a plurality of first electrical connectors formed on the second surface of the RDL structure;
    an insulating substrate having a first surface stacked on the second surface of the RDL structure;
    a conductive pattern layer comprising a first antenna element, formed in the insulating substrate and adjacent to the first surface of the insulating substrate;
    a second antenna element formed on a second surface of the insulating substrate opposite the first surface of the insulating substrate; and
    a plurality of second electrical connectors formed on the first surface of the insulating substrate and electrically connected to the first antenna element, wherein the plurality of second electrical connectors is larger than the plurality of first electrical connectors.

11. The electronic device as claimed in claim 10, wherein the plurality of first electrical connectors and the plurality of second electrical connectors are solder balls.

12. The electronic device as claimed in claim 10, further comprising:
    a passive device formed between two adjacent first electrical connectors of the first electrical connectors and electrically connected to the RDL structure.

13. The electronic device as claimed in claim 10, further comprising:
    a passive device electrically connected to the conductive pattern layer and between at least one of the first electrical connectors and at least one of the second electrical connectors.

14. The electronic device as claimed in claim 13, wherein the plurality of first electrical connectors has a height that is less than the height of the passive device.

15. The electronic device as claimed in claim 10, further comprising:

an encapsulating layer formed on the first surface of the RDL structure and surrounding the first electronic component.

16. The electronic device as claimed in claim 10, further comprising:
a second electronic component having an active surface formed on the first surface of the RDL structure; and
an encapsulating layer formed on the first surface of the RDL structure and between and surrounding the first electronic component and the second electronic component.

17. The electronic device as claimed in claim 16, wherein the second electronic component is a different size than the first electronic component.

18. The electronic device as claimed in claim 16, wherein a functional circuit of the second electronic component is different than a functional circuit of the first electronic component.

19. The electronic component as claimed in claim 10, further comprising:
at least one through-via structure formed in the insulating substrate and electrically connecting the first antenna element and the second antenna element.

20. The electronic component as claimed in claim 10, wherein the plurality of first electrical connectors electrically connects between the RDL structure and the conductive pattern layer.

\* \* \* \* \*